Figure 1:
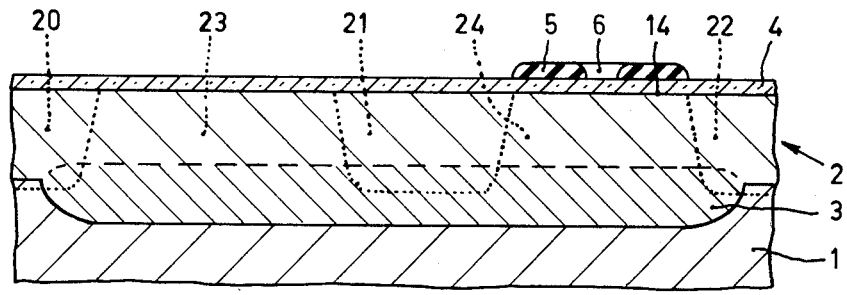

United States Patent [19]

Verkuijlen

[11] 3,996,077
[45] Dec. 7, 1976

[54] METHOD OF MANUFACTURING A SEMICONDUCTOR DEVICE HAVING AN INSULATION LAYER SUNK IN A SEMICONDUCTOR BODY AND SEMICONDUCTOR DEVICE MANUFACTURED ACCORDING TO SAID METHOD

[75] Inventor: Wilhelmus Henricus Cornelis Gerardus Verkuijlen, Eindhoven, Netherlands

[73] Assignee: U.S. Philips Corporation, New York, N.Y.

[22] Filed: Feb. 26, 1975

[21] Appl. No.: 552,976

[30] Foreign Application Priority Data

Mar. 15, 1974 Netherlands ............ 7403470

[52] U.S. Cl. .............................. 148/187; 148/175
[51] Int. Cl.$^2$ .................................. H01L 21/22
[58] Field of Search .................. 148/175, 187

[56] References Cited

UNITED STATES PATENTS

| | | |
|---|---|---|
| 3,640,806 | 2/1972 | Watanabe et al. ......... 148/187 UX |
| 3,648,125 | 3/1972 | Peltzer ....................... 148/187 UX |
| 3,796,613 | 3/1974 | Magdo et al. ............. 148/187 X |
| 3,873,989 | 3/1975 | Schinella et al. ......... 148/187 X |

OTHER PUBLICATIONS

Magdo et al. "Dielectrically Isolated Transistor," I.B.M. Tech. Disc. Bull. vol. 13, No. 11, Apr. 1971, p. 3238.

*Primary Examiner*—C. Lovell
*Assistant Examiner*—J. M. Davis
*Attorney, Agent, or Firm*—Frank R. Trifari; Leon Nigohosian

[57] ABSTRACT

A method of manufacturing a semiconductor device, comprising the steps of providing a semiconductor body comprising a first surface and an underlying semiconductor portion that is of first conductivity type, providing a doping material of said first conductivity type at a first portion of said first surface prior to the formation of a sunken insulating layer, said first portion being situated beside said sunken insulation layer, forming an insulation layer consisting of insulating material and sunk locally in said body from said first surface, and then introducing said doping material into said semiconductor body via said first portion of said first surface so as to form a zone of said first conductivity type, said zone contacting said underlying semiconductor portion, and zone extending at the area of contact to a depth greater than that of said sunken insulation layer.

18 Claims, 4 Drawing Figures

METHOD OF MANUFACTURING A SEMICONDUCTOR DEVICE HAVING AN INSULATION LAYER SUNK IN A SEMICONDUCTOR BODY AND SEMICONDUCTOR DEVICE MANUFACTURED ACCORDING TO SAID METHOD

The invention relates to a method of manufacturing a semiconductor device, in particular a monolithic integrated circuit, having a semiconductor body and comprising an insulation layer of insulating material sunk locally in the semiconductor body from a surface of said body, in which a doping material is introduced into the semiconductor material via at least one surface portion situated beside the sunken insulation layer so as to form a zone of a given conductivity type which is doped with the doping material and contacts an underlying semiconductor portion having the same conductivity type and at the area of contacting the zone extending down to a greater depth than the sunken insulation layer.

Such a method is described in an article by E. Kooi, J. G. van Lierop, W. H. C. G. Verkuylen and R. de Werdt in "Philips Research Reports" 26 (1971-06), pp. 166–180. The semiconductor devices described therein comprise a semiconductor body of silicon and a sunken insulation layer of silicon oxide obtained by the local oxidation of the silicon. The zone doped with the doping material served, for example, as a contacting zone and, as described in an embodiment in the above article, contacted on its lower side a buried, highly doped layer of the same conductivity type which was connected to the collector region of a planar transistor underneath a part of the sunken insulation layer. The contacting zone in question was obtained by a deep diffusion of the doping material in which the region destined for the transistor configuration was masked on the other side of the said part of the sunken insulation layer. For said masking, an oxide mask may be provided in known manner or the silicon nitride layer which was already present and had been used previously as a mask for the formation of the sunken insulation layer was used. In both cases a photoresist pattern should be used in which, in the case of silicon nitride, a silicon oxide layer is used in addition between the silicon nitride and the photoresist layer. Since the surface parts to be masked and those not to be masked are separated from each other by the sunken insulation layer, a very accurate alignment of the pattern of the photoresist layer was no longer deemed necessary. It was ensured that an edge of the photoresist pattern became located above the sunken insulation layer in such manner that it was sure that the masking layer on the semiconductor surface on the side where the deep diffusion had to be carried out was not covered up to the sunken insulation layer, while on the other side the masking layer on the semiconductor surface remained covered with the photoresist up to the sunken insulation layer.

However, in the etching treatments used for the local removal of the diffusion mask, the sunken insulation layer is attacked at those areas where no photoresist pattern is present. As a result of this the sunken insulation layer obtains a stepped surface. Such a surface-step formation can even be intensified in further diffusion treatments with preceding formation of diffusion mask patterns. An irregular surface of the sunken insulation layer obtained in this manner may present difficulties, for example, when a pattern of conductors has to be provided locally on such an irregular surface. For example, upon vapour-depositing the metal for the pattern of conductors, discontinuities may be formed in the deposited metal layer so that conductive connections to be formed may be interrupted. Difficulties may also occur in manufacturing a photoresist pattern in that the photoresist, upon providing it in a liquid form, may obtain an irregular thickness, for example, it may be extra thick at the lower area of the step. Upon forming the photoresist pattern the possibility exists that during the development the said thick photoresist portion remains behind entirely. For example, when the photoresist pattern is used for the formation of a pattern of conductors, various conductive connections may mutually be shortcircuited by transverse connections at the area of the step-like junction.

One of the objects of the present invention is to restrict the number of process steps in which the last-mentioned phenomenon of surface-step formation in the sunken insulation layer may occur, each one of such process steps involving an increase of the reject percentage in series production.

According to the invention, a method of manufacturing a semiconductor device, in particular a monolithic integrated circuit, having a semiconductor body and comprising an insulation layer of insulating material sunk locally in the semiconductor body from a surface of said body, in which a doping material is introduced into the semiconductor material via at least one surface portion situated beside the sunken insulation layer so as to form a zone of a given conductivity type which is doped with the doping material and contacts an underlying semiconductor portion having the same conductivity type and at that area of contacting the zone, extending down to a larger depth than the sunken insulation layer, is characterized in that the doping material is presented to the said surface portion prior to the formation of the sunken insulation layer.

As is known, the term "sunken insulation layer" relates in this connection to a depth of inset with respect to the adjacent semiconductor surface which is larger than normal differences in height of the semiconductor surface as a result of usual masked diffusion treatments, preferably larger than 0.5 $\mu$. The term "sunken" relates to the lower limits. For example, the upper side of the insulation layer may be present approximately at the same level as the adjacent semiconductor surface but may also project above it significantly.

The expression "surface portion situated beside the sunken insulation layer" is not to be restricted to its existence in the period in which the sunken insulation layer is present, but also comprises to the period prior to and during the formation of the sunken insulation layer, the expression applying to those surface portions which will become located beside said sunken insulation layer after the formation of the sunken insulation layer. Furthermore, the term "beside the sunken insulation layer" is not restricted to "laterally adjoining the sunken insulation layer." In principle this may also be understood to mean "laterally at some distance from said sunken insulation layer."

The introduction of the doping material may be carried out in the usual manner by diffusion, but it is also possible in principle to use other methods for fully or partly introducing said doping material, for example, by ion implantation.

The formation of zones of a given conductivity type which are to contact underlying semiconductor portions of the same conductivity type, in general is not critical as regards the maximum depth of such a zone, while a high doping concentration, in general, is advantageous. In particular when the zone is destined to connect a buried layer to an ohmic contact it is desirable to realise a reasonably high surface concentration combined with a comparatively high concentration of the doping material down to a comparatively large depth. For this purpose, when using a diffusion process, comparatively long heating periods are required. In the manufacture of zones to be used as parts of semiconductor circuit elements and for forming p-n junctions with underlying semiconductor regions, the heating times used are in general shorter and much more critical. It is therefore desirable to perform diffusion treatments of the first-mentioned type prior to the more critical diffusion treatments for the formation of *p-n* junctions. In a preferred embodiment of the method according to the invention a possible masking pattern for the diffusion treatment is manufactured prior to the formation of the sunken insulation layers, so that the manufacture of said pattern has no influence on the surface of the sunken insulation layer.

The expression "doping depth" of the doping material in the zone to be doped therewith is to be understood to means herein a depth down to which the doping material still appreciably influences the conductivity properties of the original semiconductor material. When the doping material changes the original conductivity type, said depth applies to the lower limit at which said change has still effectively taken place. In a material of the same conductivity type the criterion may be the depth over which the doping concentration is at least doubled. According to a preferred embodiment, the said depth is larger than the depth of the sunken insulation layer. According to a further preferred embodiment, said depth is at least so large that the conductivity properties down to an underlying highly doped buried layer are appreciably changed.

In semiconductor devices in which an epitaxial layer is used on a substrate, it may be desired to provide the substrate material on the upper side with a contact, for example, to apply a desired potential or a connection to earth, or for the connection to another contact present at a surface. In that case the method according to the invention may advantageously be used in which the zone doped with the doping material is provided in an epitaxial layer and is brought in ohmic connection with the substrate material of the same conductivity type. A further particularly favourable embodiment is obtained when the zone doped with the doping material is formed on one side of a sunken insulation layer portion and is brought in ohmic connection with a region associated with one or more semiconductor circuit elements to be formed on the other side of the sunken insulation layer portion, by means of an interconnecting zone situated below the sunken insulation layer portion. It may be connected to an electrode of such a semiconductor circuit element, but it may also be connected to a zone which insulates a semiconductor circuit element or some semiconductor circuit elements from the substrate.

Masking means are preferably used which, during the formation of the zone doped with the doping material on one side of a sunken insulation layer portion, prevents the simultaneous doping with the doping material of parts on the other side of the sunken insulation layer portion destined to incorporate one or more semiconductor circuit elements. In this latter case and also in general, when the invention is carried into effect, the said surface portion of the zone doped with the doping material may advantageously be used for the connection to deeper-situated regions, for which purpose an ohmic contact is preferably provided on said surface portion.

The invention may favourably be used in particular when silicon is used as a semiconductor material and the sunken insulation layer consists of silicon oxide. The doping material preferably consists of phosphorous to obtain a highly doped *n*-type zone. In the case in which the sunken insulation layer is formed by the local conversion of semiconductor material into insulation material, the method according to the invention may be used with advantage by performing the deep diffusion of the doping material at the same time with the generally necessary heating treatment in forming the sunken insulation layer.

With reference to the above it is to be noted that it is not necessary to carry out the deep-diffusion directly. As is known per se in planar semiconductor technology, the doping material can be introduced in two or more steps. In the present case the doping material is preferably provided, prior to the formation of the sunken insulation layer, in a layer present at the semiconductor surface and deeply diffused in the zone to be doped with the doping material in at least one heating treatment used during and/or after the formation of the sunken insulation layer. The layer present at the semiconductor surface may comprise semiconductor material in which the doping material is pre-diffused down to a small depth in a high concentration. In that case it may also consist partly of a doped layer present at the semiconductor surface. As is known in planar semiconductor technology, such a doped layer on the semiconductor surface may be formed during a pre-diffusion step. In the present case a layer from a solid phase other than that of the material of the semiconductor body is preferred, which solid phase comprises the doping material to be diffused. Upon providing said solid phase comprising the doping material on the surface portion belonging to the zone to be doped with the doping material, it is to be preferred to perform said provision without enabling the doping material to substantially diffuse into the semiconductor material. A possible simultaneous doping of semiconductor parts where said doping is not desired is prevented.

It is also to be noted that the expression the presentation of the doping material to the semiconductor surface portion in question, is not restricted to a simultaneous provision of said doping material inside the semiconductor material. Essential is that the provision of the doping material to form the zone to be doped occurs via the surface portion which is situated beside the sunken insulation layer. The provision may be effected simultaneously with the presentation, for example, in the case of ion implantation and diffusion direct from the gaseous phase. Pre-diffusion with simultaneous formation of an oxide layer containing the doped material by oxidation of the semiconductor by the action of the surrounding oxidising atmosphere, gives a presentation in which the doping material is partly provided in the semiconductor material, although not necessarily down to the ultimately required depth. In the preferred embodiment in which the doping material is provided in the form of another solid phase on the surface portion only, so not associated with a simultaneous diffusion, the doping material is presented but is not yet introduced in the semiconductor. The said solid phase preferably consists of oxide containing the doping material.

In the previous presentation of the doping material in the form of a layer to the surface portion in question of the doped zone to be formed, the introduction of the doping material in undesired semiconductor portions during the subsequent deeper diffusion can be prevented by using at least one diffusion masking layer on the relevant layer comprising the doping material. The layer comprising the doping material may first be provided previously throughout the surface and then be restricted to a pattern on the surface portions where the doping material is to be diffused in the semiconductor material. Actually, when in such a case photoresist patterns are used, undesired pores therein ("pinholes") can emerge at the surface only where the deep doped zone is to be formed. In the long run, pinholes therein will hardly be noticed or at least no trouble will be experienced from them. This means an advantage with respect to diffusion from the gaseous phase with the use of a masking pattern on those portions where the diffusion of the doping material should be prevented. The photoresist methods used may give pinholes in said diffusion masking layer in which undesired doping of semiconductor portions may take place and such doping may render the semiconductor device to be manufactured useless, for example, by shortcircuiting.

It has already been stated above that the previous provision of the doping material in the form of a comparatively thin layer has the advantage that the layer can be provided throughout the surface and then be restricted to the desired surface portions where the doping material is to be diffused deeply, the layer being removable from the other parts with the use of a photoresist masking. It will be obvious that, if the layer consists entirely or partly of a superficial part of the semiconductor material which has been prediffused with the doping material, the local etching away of the predoped semiconductor material may provide an irregular surface. However, the use of a layer of a solid phase other than the semiconductor material, which layer comprises the doping material, in which prediffusion in the semiconductor material has been omitted, makes the local etching away of semiconductor material as described above superfluous.

The layer with the doping material and thereon the diffusion masking layer may be provided throughout the surface and then both be removed from the same surface portions while using a single photoresist method. A subsequent vapour deposition of the doped material to expose surface portions in then substantially prevented by the presence of the diffusion masking layer on the layer with doping material. However, in order to more efficaciously check such a small doping possibility in those semiconductor portions where this is undesired, the diffusion masking layer is or the diffusion masking layers are preferably provided throughout the surface only after the restriction of the layer containing the doping material to the desired areas. In the latter case the manufacture of the semiconductor device may be simplified by the use of a masking layer which may also be used for masking during the formation of the sunken insulation layers.

The invention also comprises semiconductor devices manufactured while using the method according to the invention.

The invention will be described in greater detail with reference to the accompanying drawing, in which:

FIGS. 1 to 4 are diagrammatic detailed cross-sectional views of the successive stages in the manufacture of a semiconductor device according to an embodiment of the invention.

A substrate body 1 of monocrystalline high-ohmic p-type silicon (see FIG. 1) is used as the starting material for the manufacture of a semiconductor device, for example an integrated circuit, comprising at least one transistor. Low-ohmic n-type zones are formed at a major surface by local diffusion of arsenic. An epitaxial layer 2 of high-ohmic n-type silicon is then provided on the substrate body 1. The low-ohmic n-type zones formed at the substrate-surface thus form low-ohmic n-type buried layers, for example, the buried layers, for example, the buried layer 3.

Figure 4:
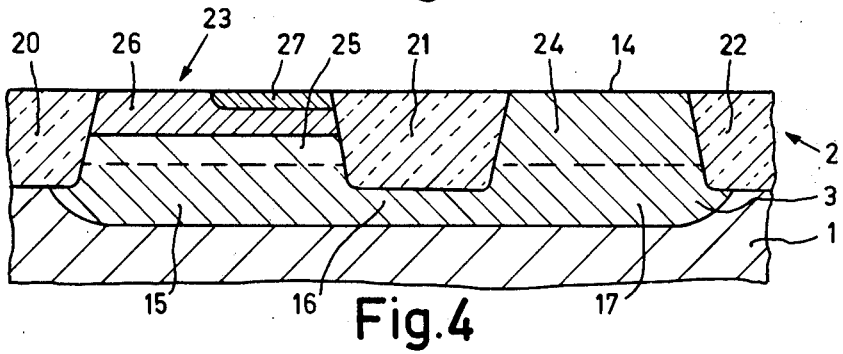

The semiconductor body thus obtained is used as the starting material for the manufacture of an integrated circuit a part of which is shown diagrammatically in FIG. 4. For a lateral separation of various parts of the integrated circuit a sunken insulation layer is locally used of which FIG. 4 shows diagrammatically the parts 20, 21 and 22. The sunken insulation layer has a pattern in the form of a network which laterally bounds the various portions present at the semiconductor surface, for example portions 23 and 24. The sunken insulation layer may locally contact the p-type substrate material as is shown in FIG. 4 for the insulation layer portions 20 and 22. If desired, a channel interrupting zone in the form of a p-type buried layer (not shown in the figures) may be provided below the insulation layer portions 20 and 22. Such a layer may be obtained, for example, by the local diffusion of boron in the substrate surface. It is also possible that the sunken insulation layer is not sunk entirely through the epitaxial layer 2. Actually it is possible to use, below the sunken insulation layer portions 20 and 22, a buried zone obtained, for example, by diffusion of boron in the substrate surface, which zone joins the sunken insulation layer portions 20 and 22 by diffusion in the epitaxial layer from the substrate surface.

In the present embodiment, an npn-transistor is formed in the semiconductor portion 23 situated at the surface, which transistor has an n-type emitter 27 present at the surface, a p-type base 26 and an n-type collector 25. The p-n junction between the p-type base region 26 and the n-type region 25 is laterally bounded entirely by the sunken insulation layer. The comparatively high-ohmic collector region 25 is connected at its lower side to the part 15 of the highly doped n-type buried layer 3. Said n-type buried layer 3 further extends with a part 16 below the sunken insulation layer portion 21 and with a region 17 below the semiconductor portion 24. Said semiconductor portion 24 is comparatively highly doped. In this manner the collector region 25 may be provided with a contact via the buried layer 3 and the low-doped semiconductor portion 24 at the surface portion 14 of said portion 24.

For the manufacture of said configuration from the already mentioned semiconductor body with p-type substrate 1, buried n-type layers, for example, buried n-type layer 3, and n-type epitaxial layer 2 (see FIG. 1), a layer 4 of phosphate glass is provided throughout the surface. This layer may be provided in known manner by oxidation of gaseous silicon hydride and phosphine with oxygen, a sufficiently low temperature, for example, 400° C, being used in order that no phosphorus diffusion in the silicon takes place. Said layer 4 of phosphate glass should now be restricted to those parts of the semiconductor surface where a deep phosphorus diffusion should take place, for example, the surface 14 of the portion 24 present at the semiconductor surface. For that purpose, a photoresist pattern 5 is formed in known manner optically. The resulting stage is shown in FIG. 1.

Figure 2:
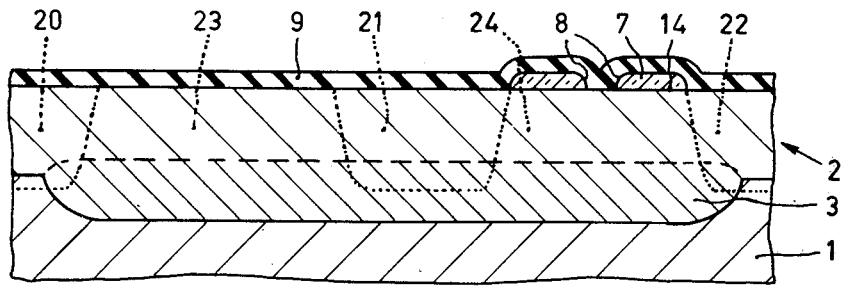

The dotted lines in FIGS. 1 and 2 denote the places where the portions 20, 21 and 22 of the sunken insulation layer pattern are to be provided, while the semiconductor portions 23 and 24 present at the surface and bounded laterally by same are also denoted in dotted lines in these figures. As is shown in FIG. 1, the photoresist pattern 5 is present right above the surface portion 14 of the semiconductor portion 24, but not right above the semiconductor portion 23 which is destined to comprise the transistor.

When a photoresist pattern is obtained optically the possibility exists that unexpected pores, so-called pinholes, are formed in the photoresist pattern, for example, an aperture (pinhole) 6 in the photoresist pattern 5.

The oxide layer 4, containing the doping material phosphorus is now etched away from the parts not covered by the photoresist pattern 5. During said etching treatment the underlying silicon is not attacked substantially so that no step-like semiconductor surface is obtained. If desired, the released silicon surface is then etched for a very short period for cleaning purposes. Phosphorus which may have diffused in an extremely thin semiconductor surface layer is removed in this manner but a significant surface relief formation is out of the question. The portion of the original layer 4 of phosphate glass covered by the photoresist pattern 5 remains behind. For example, a portion 7 of the layer of phosphate glass remains on the surface portion 14. In this portion 7, the oxide may be etched away at the area of pinholes, for example of pinhole 6, so that apertures, for example aperture 8, are formed in the layer portion 7 of phosphate glass.

After removing the photoresist pattern 5 diffusion masking means are provided through the surface. In this case, a layer 9 of silicon nitride is provided after the deposition of a thin silicon oxide layer (not shown). The combination of the layer of silicon oxide and the silicon nitride is masking for diffusion of most doping impurities for silicon, for phosphorus diffusion to be carried out in this case. Furthermore, the silicon nitride layer may also be used as masking means in the local manufacture of sunken oxide layers, as will be described hereinafter. The resulting stage is shown in FIG. 2. Both the semiconductor surface and the pattern of phosphate glass, for example the portion 7, are covered with the layer of silicon oxide and silicon nitride.

A sunken insulation layer is then provided, the silicon nitride layer 9 being used for masking the silicon portions, for example portions 23 and 24, where said sunken insulation layers are not desired. For this purpose, apertures 10 are provided in known manner in the silicon nitride layer 9 according to the network of the desired sunken insulation layer pattern. The sunken insulation layer pattern is formed in known manner by oxidation of the non-masked silicon. Since the volume of the formed silicon oxide is larger than the volume of the converted silicon, said oxide layer will normally project also above the silicon surface. It is also possible, prior to the oxidation, to etch grooves in the silicon via the windows 10, an oxide layer possibly used below the silicon nitride being, of course, removed at that area. Said grooves are filled in the subsequent oxidation treatment by the silicon oxide formed.

In the oxidation treatment required to form sufficiently thick sunken oxide layers, temperatures and treatment times are necessary which are sufficiently large for a deep diffusion of phosphorus. For example, for the formation of an approximately 2 $\mu$ thick silicon oxide layer, a treatment in steam of 1000° C may be used for 16 hours. At that temperature the phosphorus will diffuse from the phosphate glass pattern, for example, the phosphate glass portion 7, in the underlying silicon and that in the treatment time used in such manner that the whole semiconductor portion 24 obtains a high donor doping down to the buried insulation layer 3. The phosphorus cannot diffuse in the portion 23, on the one hand since said portion is covered with a diffusion mask of silicon oxide and silicon nitride, on the other hand because phosphorus cannot escape from the phosphate glass layer pattern into the surrounding atmosphere, since said pattern of phosphate glass layers, for example the portion 7 on the surface 14, is covered with silicon oxide and silicon nitride.

Figure 3:
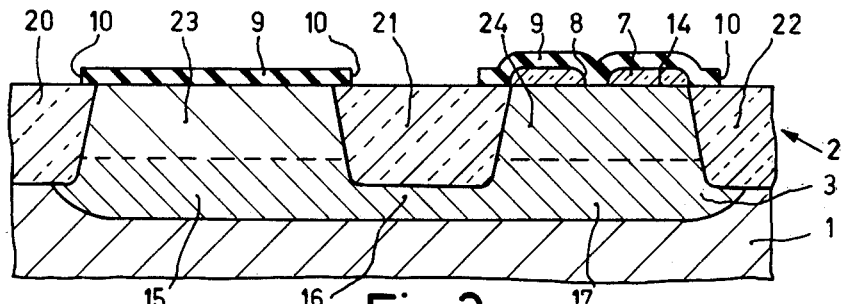

It is to be noted that in the deep diffusion of the phosphorus an accidental aperture 8 in the phosphate glass layer pattern has substantially no influence on the doping of the semiconductor portion 24. As a result of the oxidation, a sunken insulation layer pattern has furthermore formed below the apertures 10 in the silicon nitride layer 9. The resulting stage is shown in FIG. 3. The sunken insulation layer portions 20, 21 and 22 are shown diagrammatically. Furthermore the upper limit of the low-ohmic buried $n$-type layer 3 is denoted by a broken line. As a result of the diffusion of the phosphorus, the whole semiconductor region 24 is highly doped with phosphorus down to the buried layer 3. It is to be noted that such a low-ohmic junction between the surface 14 and the buried layer 3 is also obtained if said buried layer 3 is present still considerably lower, namely below the lowest level of the sunken insulation layer. As stated above, such a lower situated buried $n$-type layer 3 may be used if in addition boron-doped buried zones are used below the sunken insulation layer portions 20 and 22 which zones, after the temperature treatment used, extend down to the sunken insulation layer portions.

Starting from the structure shown in FIG. 3, semiconductor circuit elements can now be formed in known manner, for example, the *npn*-transistor in the semiconductor portion 23. For this purpose and while masking the surface portion 14, a base diffusion to form the base 26 may be carried out by diffusion of boron, after which the emitter zone 27 can be obtained in a subsequent diffusion step by a short-lasting diffusion of phosphorus. In this latter step the surface 14 may also be exposed to said phosphorus treatment. The resulting stage is shown in FIG. 4. Oxide coatings, if any, on the portions 23 and 24 are not shown in FIG. 4. Such a coating may be used, for example, at the area where the *p-n* junction between the base 26 and the emitter 27 merges at the semiconductor surface. At the area where the *p*-type zone 26 merges at the semiconductor surface, a base contact is then provided. The collector contact is provided on the surface portion 14. The readily soluble phosphate glass layer portion 7 with the oxide provided thereon may be removed, after the removal of the silicon nitride, by a short-lasting dip etching treatment without an annoyingly deep attack of the sunken oxide being obtained. The collector contact is in ohmic connection with the collector 25 via the highly doped n-type region 24 and the portions 17, 16 and 15 of the buried layer 3.

It is to be noted that in semiconductor portions such as the portion 23, semiconductor circuit elements other than transistors may be provided, in particular semiconductor circuit elements of which a deeply-situated part is to be provided with a contact present at the surface. For example, the portion 25 may also be an electrode of a diode. A deeply-situated connection may also be made with semiconductor material which forms the substratum of a field effect transistor having a gate electrode which is separated from the gate region by insulation material.

It is furthermore possible, for example, to perform a deep boron diffusion on the side of the sunken insulation layer portion 20 not shown, in which there is proceeded in a similar manner as in the doping of the region 24. As a result of this the possibility is presented to provide the p-type substrate material with an ohmic contact on the surface of the epitaxial layer 2. For this purpose, actually, preceding the formation of the sunken insulation layer, a borate glass pattern may locally be provided and be covered with the silicon nitride. During the formation of the sunken insulation pattern the boron may diffuse down to the substrate or down to a boron-doped buried zone at the high temperature used.

It will be obvious that the invention is not restricted to the above-described embodiment but that many variations are possible to those skilled in the art without departing from the scope of this invention.

What is claimed is:

1. A method of manufacturing a semiconductor device, comprising the steps of:
    a. providing a semiconductor body comprising a first surface and an underlying semiconductor portion that is of first conductivity type;
    b. providing a doping material of said first conductivity type at a first portion of said first surface prior to the formation of a sunken isolation layer, said first portion being situated beside said sunken isolation layer;
    c. forming the isolation layer consisting of insulating material and sunk locally in said body from said first surface; and
    d. introducing said doping material into said semiconductor body via said first portion of said first surface so as to form a zone of said first conductivity type, said zone contacting said underlying semiconductor portion and extending at the area of contact to a depth greater than that of said sunken isolation layer.

2. A method as in claim 1, comprising the step of providing at least one masking layer at further portions of said first surface so as to prevent provision of said doping material at said further semiconductor portions situated beside said sunken isolation layer.

3. A method as in claim 1, wherein said doping material is introduced into said semiconductor body down to a certain depth so as to produce said zone and so that the specific conductivity of the original part of said semiconductor body thereat has its conductivity level significantly increased.

4. A method as in claim 1, further comprising the step of forming in said semiconductor body a highly doped buried layer of said first conductivity type and providing said doping material down to such a depth that the original part of said semiconductor body thereat has its conductivity level significantly increased and said part extends at least down to said buried layer.

5. A method as in claim 1, wherein said semiconductor body comprises an epitaxial layer and a substrate that are of said first conductivity type and said first conductivity type zone is in ohmic contact with said substrate.

6. A method as in claim 1, wherein said first conductivity type zone is formed on one side of a portion of said sunken isolation layer and is ohmically connected by means of an inter-connecting zone situated below said sunken isolation layer portion, with a region associated with one or more semiconductor circuit elements to be formed on said other side of said sunken isolation layer portion.

7. A method as in claim 6, wherein during the step of forming said zone, masking means are used to prevent the simultaneous doping with the doping material of semiconductor portions situated at the other side of said sunken isolation layer portion.

8. A method as in claim 1, wherein an ohmic contact is provided at said surface portion for electrical connection to said zone.

9. A method as in claim 1, wherein the step of forming said sunken isolation layer comprises local conversion of a part of said semiconductor body into isolation material.

10. A method as in claim 1, wherein said semiconductor material is silicon and said sunken isolation layer is silicon oxide.

11. A method as in claim 10, wherein said doping material is phosphorus.

12. A method as in claim 1, wherein prior to the formation of said sunken insulation layer, said doping material is so provided in a layer situated at the semiconductor surface and is so introduced with said body by deeply diffusing said doping material thereinto by at least one heating treatment conducted during and/or after the formation of the sunken insulation layer.

13. A method as in claim 12, wherein said doping material is provided on said surface first portion in the form of a layer from a solid phase other than that of the material of the semiconductor body.

14. A method as in claim 12, wherein said layer consists essentially of oxide containing the doping material.

15. A method as in claim 12, comprising the step of covering said layer containing said doping material is covered with at least one diffusion masking layer.

16. A method as in claim 5, wherein said layer comprising said doping material is first provided through throughout the surface and then a portion thereof is removed so that the remaining part of said layer is restricted to a pattern on said surface first portion where the doping material is to be diffused into said semiconductor material.

17. A method as in claim 6, wherein said at least one diffusion masking layer is provided after such formation of said pattern of the layer comprising the doping material.

18. A method as in claim 17, wherein said at least one diffusion masking layer consists at least partly of a material which may have a masking effect in the manufacture of the sunken insulation layer and is locally removed according to the pattern of the sunken insulation layer to be formed.

* * * * *

UNITED STATES PATENT AND TRADEMARK OFFICE
CERTIFICATE OF CORRECTION

PATENT NO. : 3,996,077
DATED : December 7, 1976
INVENTOR(S) : WILHELMUS H.C.G. VERKUIJLEN It is certified that error appears in the above-identified patent and that said Letters Patent are hereby corrected as shown below:

Claim 1, line 18, delete "and"
Claim 12, line 2, change "insulation" to --isolation--
         line 4, change "with" to --in--
         line 7, change "insulation" to --isolation--
Claim 15, line 2, delete "is"
         line 3, delete "covered."
Claim 16, line 1, change "5" to --15--
         line 2, delete "through."
Claim 17, line 1, change "Claim 6" to --Claim 16--
Claim 18, line 4, change "insulation" to --isolation--
         line 5, delete "insula-"
         line 6, change "tion" to --isolation--

Signed and Sealed this

Twenty-seventh Day of May 1980

[SEAL]

Attest:

SIDNEY A. DIAMOND

Attesting Officer    Commissioner of Patents and Trademarks